United States Patent
Li

(10) Patent No.: US 8,143,960 B2
(45) Date of Patent: Mar. 27, 2012

(54) VOLTAGE CONTROLLED OSCILLATOR WITH MULTI-TAP INDUCTOR

(75) Inventor: Qiang Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/011,356

(22) Filed: Jan. 25, 2008

(65) Prior Publication Data

US 2009/0189704 A1 Jul. 30, 2009

(51) Int. Cl.
*H03B 5/12* (2006.01)

(52) U.S. Cl. ............... 331/117 FE; 331/36 L; 331/181; 331/49

(58) Field of Classification Search ............... 331/46, 331/48, 49, 56, 179, 117 R, 117 FE, 167, 331/36 L, 181

See application file for complete search history.

(56) References Cited

U.S. PATENT DOCUMENTS

| | | | |
|---|---|---|---|
| 6,304,146 B1 * | 10/2001 | Welland | 331/2 |
| 6,861,913 B1 * | 3/2005 | Herzel et al. | 331/117 R |
| 6,911,870 B2 * | 6/2005 | Gierkink et al. | 331/46 |
| 7,915,967 B2 * | 3/2011 | Herbert | 331/167 |
| 2008/0278250 A1 * | 11/2008 | Hung et al. | 331/117 R |

* cited by examiner

*Primary Examiner* — Ryan Johnson
(74) *Attorney, Agent, or Firm* — Farjami & Farjami LLP

(57) ABSTRACT

According to one exemplary embodiment, a voltage controlled oscillator configured to operate in low and high band modes includes a low band section and a high band section. The voltage controlled oscillator further includes a multi-tap inductor having a high inductance portion coupled to the low band section and a low inductance portion coupled to the high band section. The low band section is configured to provide a low frequency band oscillator output in the low band mode and the high band section is configure to provide a high frequency band oscillator output in the high band mode. The low band section is disabled in the high band mode and the high band section is disabled in the low band mode. A center tap of the multi-tap inductor is coupled to a supply voltage.

19 Claims, 3 Drawing Sheets ic circuits. More specifically, the present invention is in the field of oscillators and tuning circuits.

VOLTAGE CONTROLLED OSCILLATOR WITH MULTI-TAP INDUCTOR

BACKGROUND OF THE INVENTION

1. Field of the Invention

The present invention is generally in the field of electrical circuits. More specifically, the present invention is in the field of oscillators and tuning circuits.

2. Background Art

Voltage controlled oscillators (VCOs) can be utilized to provide operating frequencies for communications devices, such as cell phones, as well as other types of electronic devices. VCOs in communications devices, such as cell phones, can typically be adjusted to provide a range of output frequencies, thereby enabling the communications devices to support multiple frequency bands for communications standards such as Global System for Mobile Communication (GSM), Extended GSM (EGSM), Digital Cordless Standard (DCS), and Personal Communications Service (PCS), and Wideband Code-Division Multiple Access (WCDMA). However, with the addition of frequency bands VII and XI and frequency bands for communications standards such as Long Term Evaluation (LTE), it is increasingly more difficult for VCOs in the communications devices, such as cell phones, to provide the increased frequency range required to support the additional bands.

In one conventional solution, multiple VCOs are incorporated in a communications device, where each VCO handles a portion of the required frequency range. However, the multiple VCOs undesirably require significantly more semiconductor die size than a single VCO. In another conventional solution, the capacitance of an adjustable coarse tuning capacitors in the tank circuit of the VCO is increased to allow the VCO to cover the required frequency range. However, since the quality factor (Q) of the tank circuit is inversely proportional to the square root of the tank circuit capacitance, increasing the capacitance undesirably lowers the Q of the tank circuit. Also, by lowering the tank circuit Q, VCO phase noise, which is inversely proportional to the Q of tank circuit, is undesirably increased.

SUMMARY OF THE INVENTION

A voltage controlled oscillator with a multi-tap inductor substantially as shown in and/or described in connection with at least one of the figures, as set forth more completely in the claims.

DETAILED DESCRIPTION OF THE INVENTION

The present invention is directed to a voltage controlled oscillator with multi-tap inductor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
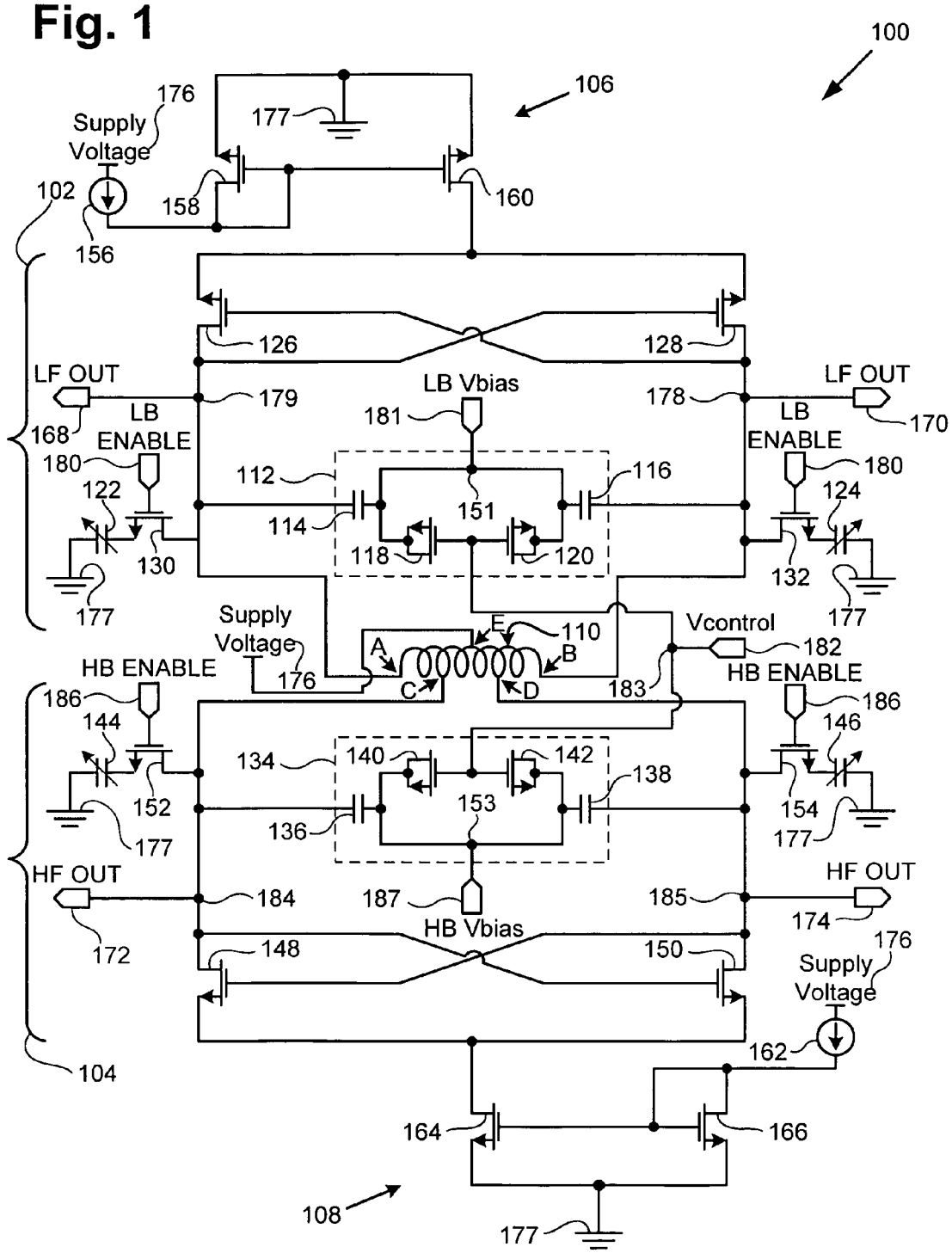
FIG. 1 shows a circuit diagram of an exemplary voltage controlled oscillator in accordance with one embodiment of the present invention.

FIG. 1 shows a circuit diagram of VCO (voltage controlled oscillator) 100 in accordance with one embodiment of the present invention. VCO 100 includes low band section 102, high band section 104, low band bias circuit 106, high band bias circuit 108, and multi-tap inductor 110. Low band section 102 includes low band fine tuning circuit 112 (simply referred to as "fine tuning circuit 112"), which includes capacitors 114 and 116 and varactors 118 and 120, coarse tuning capacitors 122 and 124, and transistors 126, 128, 130, and 132. High band section 104 includes high band fine tuning circuit 134 (simply referred to as "fine tuning circuit 134"), which includes capacitors 136 and 138 and varactors 140 and 142, coarse tuning capacitors 144 and 146, and transistors 148, 150, 152, and 154. Low band bias circuit 106 includes current source 156 and transistors 158 and 160 and high band bias circuit 108 includes current source 162 and transistors 164 and 166. Multi-tap inductor 110 in VCO 100 is an on-chip inductor, i.e., multi-tap inductor 110 can be fabricated on a semiconductor die (not shown in FIG. 1).

VCO 100 can be utilized in a radio frequency (RF) transceiver in a communications device, such as a cell phone. However, VCO 100 can generally be utilized in any electronic device that requires a VCO having a wide tuning range. VCO 100 can be configured to operate in a low band to provide low frequency band oscillator outputs (LF OUT) 168 and 170, which are differential outputs, via low band section 102 and to operate in a high band mode to provide high frequency band oscillator outputs (HF OUT) 172 and 174, which are differential outputs, via high band section 104. In the low band mode, LF OUT 168 and 170 can provide a frequency range of, for example, between approximately 3.0 gigahertz (GHz) and 4.5 GHz, which can be appropriately divided to provide frequency bands for communications standards such as EGSM, GSM, DCS, PCS, and WCDMA. In the high band mode, HF OUT 172 and 174 can provide a frequency range of, for example, between approximately 4.5 GHz and 6.0 GHz, which can be appropriately divided to provide a frequency range for bands VII and XI for LTE standard.

As shown in FIG. 1, current source 156, which is a switchable current source, is coupled between supply voltage 176, e.g., VDD, and the gate and drain of transistor 158 and the gate of transistor 160, and the sources of transistors 158 and 160 are coupled to ground 177. Current source 156 can be turned on to provide a bias current for low band section 102 when VCO 100 is operating in a low band mode and can be turned off when VCO 100 is operating in a high band mode. Transistors 158 and 160 can each be, for example, an n-channel field-effect transistor (NFET). Also shown in FIG. 1, the drain of transistor 160 is coupled to the sources of transistors 126 and 128, the gate of transistor 126 is coupled to the drain of transistor 128 at node 178, and the gate of transistor 128 is coupled to the drain of transistor 126 at node 179. Transistors 126 and 128 can each be, for example, an NFET. Node 178 and node 179 of low band section 102 provide LF OUT 170 and LF OUT 168, respectively, which are differential low band outputs.

Further shown in FIG. 1, coarse tuning capacitors 122 and 124 are coupled between ground 177 and the sources of transistor 130 and 132, the gates of transistor 130 and 132 are coupled to low band coarse tuning enable signal (LB ENABLE) 180, and the drains of transistors 130 and 132 are coupled to nodes 179 and 178, respectively. LB ENABLE 180 can be configured to couple coarse tuning capacitors 122 and 124 to nodes 179 and 178 in a low band mode by providing a high voltage to turn on transistors 130 and 132, respectively. LB ENABLE 180 can also be configured to decouple coarse tuning capacitors 122 and 124 from nodes 179 and 178 in a high band mode by providing a low voltage to turn off transistors 130 and 132, respectively, thereby preventing low band section 102 from impacting high band oscillating. Transistors 130 and 132 can each be, for example, an NFET.

Also shown in FIG. 1, first terminals of capacitors 114 and 116 are coupled to respective nodes 179 and 178, second terminals of capacitors 114 and 116 are coupled to low band bias voltage (LB Vbias) 181 and first terminals of varactors 118 and 120 at node 151, and second terminals of varactors 118 and 120 are coupled to control voltage (Vcontrol) 182 at node 183. Varactors 118 and 120 can each comprise, for example, an NFET, where the source and drain of the NFET are shorted together to form a first varactor terminal and the gate of the NFET forms a second varactor terminal. Varactors 118 and 120 can each operate as a voltage-controlled capacitor, where a differential voltage applied between the first and second terminals can determine the capacitance across each varactor. The capacitance of each of capacitors 112 and 116 can be significantly larger than the capacitance of each of varactors 118 and 120, which are coupled in series with capacitors 112 and 116. As a result, the capacitance of fine tuning circuit 112 can be approximately equal to the capacitance of varactors 118 and 120, which can be controlled by Vcontrol 182.

Further shown in FIG. 1, multi-tap inductor 110 includes a high inductance portion situated between taps A and B, which is coupled to low band section 102, a low inductance portion situated between taps C and D, which is coupled to high band section 104, and tap E, i.e., the center tap, which is coupled to supply voltage 176, e.g., VDD. In the present embodiment, taps A and B are situated at the respective ends of multi-tap inductor 110. In another embodiment, tap A and/or tap B may not be situated at an end of the multi-tap inductor 110. The high inductance portion of multi-tap inductor 110 has a higher inductance than the low inductance portion of the multi-tap inductor because the length of the conductor that forms multi-tap inductor 110 is longer between taps A and B than between taps C and D. The high inductance portion of multi-tap inductor 110 can have an inductance equal to, for example, less than approximately 1.0 nanohenry. The low inductance portion of multi-tap inductor 110 can have an inductance value equal to approximately 0.5 nanohenry, for example. In the present embodiment, multi-tap inductor 110 has five taps, i.e., taps A, B, C, D, and E. In another embodiment, multi-tap inductor 110 may have a different number of taps.

Also shown in FIG. 1, current source 162, which is a switchable current source, is coupled between supply voltage 176, e.g., VDD, and the gate and drain of transistor 166 and the gate of transistor 164, and the sources of transistors 164 and 166 are coupled to ground 177. Current source 162 can be turned on to provide a bias current for high band section 104 when VCO 100 is operating in a high band mode and can be turned off when VCO 100 is operating in a low band mode. Transistors 164 and 166 can each be, for example, an NFET. Further shown in FIG. 1, the drain of transistor 164 is coupled to the sources of transistors 148 and 150, the gate of transistor 148 is coupled to the drain of transistor 150 at node 185, and the gate of transistor 150 is coupled to the drain of transistor 148 at node 184. Transistors 148 and 150 can each be, for example, an NFET. Node 184 and node 185 of high band section 104 provide HF OUT 172 and HF OUT 174, respectively, which are differential high band outputs.

Although high band section 104 has the same circuit architecture as low band section 102, high band section 104 is coupled to a lower inductance portion of multi-tap inductor 110 than low band section 102. As a result, the circuit parameters of low band section 102 and high band section 104 are different. For example, the size and transconductance (Gm) of transistors 126 and 128 is different than the size and Gm of transistors 148 and 150. For example, transistors 148 and 150 can have a larger size than transistors 126 and 128.

Also shown in FIG. 1, coarse tuning capacitors 144 and 146 are coupled between ground 177 and the sources of transistor 152 and 154, the gates of transistor 152 and 154 are coupled to high band coarse tuning enable signal (HB ENABLE) 186, and the drains of transistors 148 and 150 are coupled to nodes 184 and 185, respectively. HB ENABLE 186 can be configured to couple coarse tuning capacitors 144 and 146 to nodes 184 and 185 in a high band mode by providing a high voltage to turn on transistors 152 and 154, respectively. HB ENABLE 186 can also be configured to decouple coarse tuning capacitors 144 and 146 from nodes 184 and 185 in a low band mode by providing a low voltage to turn off transistors 152 and 154, respectively, thereby preventing high band section 104 from oscillating. Transistors 152 and 154 can each be, for example, an NFET.

Further shown in FIG. 1, first terminals of capacitors 136 and 138 are coupled to respective nodes 184 and 185, second terminals of capacitors 136 and 138 are coupled to high band bias voltage (HB Vbias) 187 and first terminals of varactors 140 and 142 at node 153, and second terminals of varactors 140 and 142 are coupled to Vcontrol 182 at node 183. Varactors 140 and 142 are substantially similar in composition and operation as respective varactors 118 and 120 discussed above. The capacitance of each of capacitors 136 and 138 can be significantly larger than the capacitance of each of varactors 140 and 142, which are coupled in series with capacitors 136 and 138. As a result, the capacitance of fine tuning circuit 134 is approximately equal to the capacitance of varactors 140 and 142, which can be controlled by Vcontrol 182.

The operation of VCO 100 in low and high band modes will now be discussed. In the low band mode, low band section 102 is enabled by turning on current source 156 to provide bias current to low band section 102 and setting LB ENABLE 180 to a high voltage level to turn transistors 130 and 132, thereby coupling coarse tuning capacitors 122 and 124 to fine tuning circuit 112. In the low band mode, LB Vbias 181 is set to provide an appropriate bias voltage to varactors 118 and 120 at node 151. In the low band mode, VCO 100 has a tank circuit including fine tuning circuit 112 and coarse tuning capacitors 122 and 124, which provide capacitance, and a high inductance portion of multi-tap inductor 110 between taps A and B, which provides inductance. Center tap E of multi-tap inductor 110 provides a supply current to low band section 104.

Coarse tuning capacitors 122 and 124 are adjusted to tune between different bands in the low band frequency range, which can be, for example, between approximately 3.0 GHz and 4.5 GHz. Once a band has been selected by coarse tuning capacitors 122 and 124, fine tuning circuit 112 is adjusted to tune to a desired frequency within the selected band by utilizing Vcontrol 182 to vary the capacitance of varactors 118 and 120. In the low band mode, low band section 102 is configured to provide differential LB outputs 168 and 170 at respective nodes 179 and 178. To prevent high band section 104 from interfering with low band section 102 in the low band mode, current source 162 is turned off and HB ENABLE 186 is set to a low voltage level to decouple coarse tuning capacitors 144 and 146 from multi-tap inductor 110. Also, HB Vbias 187 is set equal to Vcontrol 182 to prevent fine tuning circuit 134 from providing a varying capacitance across taps C and D of multi-tap inductor 110.

In the high band mode, high band section 104 is enabled by turning on current source 162 to provide bias current to high band section 104 and setting HB ENABLE 186 to a high voltage level to turn transistors 152 and 154, thereby coupling coarse tuning capacitors 144 and 146 to respective nodes 184 and 185. In the high band mode, HB Vbias 187 provides an appropriate bias voltage to varactors 140 and 142 at node 153. In the high band mode, VCO 100 has a tank circuit including fine tuning circuit 134 and coarse tuning capacitors 144 and 146, which provide capacitance, and a low inductance portion of multi-tap inductor 110 between taps C and D, which provides inductance. Center tap E of multi-tap inductor 110 provides a supply current to high band section 104.

Coarse tuning capacitors 144 and 146 are adjusted to tune between different bands in the high band frequency range, which can be, for example, between approximately 4.5 GHz and 6.0 GHz. Once a band has been selected by coarse tuning capacitors 144 and 146, fine tuning circuit 134 is adjusted to tune to a desired frequency within the selected band by utilizing Vcontrol 182 to vary the capacitance of varactors 140 and 142. In the high band mode, high band section 104 is configured to provide differential HF outputs 172 and 174 at respective nodes 184 and 185. To prevent low band section 102 from interfering with high band section 104 in the high band mode, current source 156 is turned off, LB ENABLE 180 is set to a low voltage level to decouple coarse tuning capacitors 122 and 124 from multi-tap inductor 110, and LB Vbias 181 is set equal to Vcontrol 182, which prevents fine tuning circuit 112 from providing a varying capacitance load on multi-tap inductor 110 across taps A and B.

The output frequency of VCO 100 is inversely proportional to the square root of the product of L and C, where L corresponds to the inductance of the tank circuit and C corresponds to the capacitance of the tank circuit. Thus, to provide a higher output frequency, the product of L and C needs to decrease, and vice versa. Also, the Q (quality factor) of the tank circuit in VCO 100, which is equal to the energy stored in the tank circuit divide by the energy dissipated, is proportional to the square root of L divided by C. Thus, as C increases, the Q of the tank circuit decreases, and vice versa. Also, as L increases, the Q of the tank circuit increases, and vice versa.

Thus, by utilizing multi-tap inductor 110 to provide a higher tank circuit inductance in a low band mode and a lower tank circuit inductance in a high band mode, the invention's VCO 100 can provide a wide tuning range by utilizing a lower coarse tuning capacitance. In contrast, a conventional VCO, which utilizes a tank circuit having a fixed inductance, requires a significantly larger coarse tuning capacitance to provide a similar tuning range. Thus, by utilizing a multi-tap inductor to reduce the coarse tuning capacitance, the invention provides a VCO having an increased tank circuit Q compared to a conventional VCO. Also, since the Q of the tank circuit is inversely proportional to phase noise, by increasing the Q of the tank circuit, the invention advantageously provides a VCO having reduced phase noise. Also, by utilizing a multi-tap inductor to provide a VCO having a wide tuning range, the present invention advantageously achieves a VCO that utilizes significantly less semiconductor die area compare to a conventional solution that utilize multiple VCOs to achieve a wide tuning range.

Figure 2:
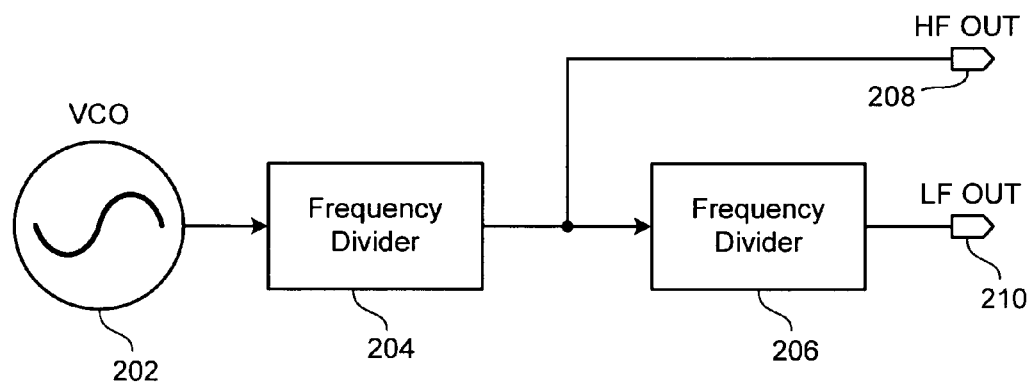
FIG. 2 shows a block diagram of an exemplary voltage controlled oscillator coupled to frequency dividers in accordance with one embodiment of the present invention.

FIG. 2 shows a block diagram of VCO 202 coupled to frequency dividers 204 and 206 in accordance with one embodiment of the present invention. In FIG. 2, VCO 202 corresponds to VCO 100 in FIG. 1. As shown in FIG. 2, the output of VCO 202 is coupled to the input of frequency divider 204, the output of frequency divider 204, which provides high frequency output (HF OUT) 208, is coupled to the input of frequency divider 206, which provides low frequency output (LF OUT) 210. VCO 202 can output a frequency range of, for example, between approximately 3.0 GHz and 6.0 GHz. Frequency divider 204 can be a divide-by-two frequency divider and can be configured to receive the output of VCO 202, divide the output of VCO 202 by two, and provide HF OUT 208. HF OUT 208 can have a frequency range of, for example, between approximately 1.7 GHz and 2.6 GHz.

HF OUT 208 can provide operating frequencies for communications standards such as WCDMA, DCS, and PCS and can also provide operating frequencies in band VII. Frequency divider 206 can be a divide-by-two frequency divider and can be configured to receive HF OUT 208 from frequency divider 204, divide HF OUT 208 by two, and provide LF OUT 210. LF OUT 210 can have a frequency range of, for example, between approximately 0.8 GHz and 1.5 GHz. HF OUT 208 can provide operating frequencies for communications standards such as EGSM and GSM and can also provide operating frequencies in band XI. Thus, by utilizing a multi-tap inductor for operation in low and high band modes as discussed above, the invention provides a VCO that can provide an output having a wide frequency range for supporting frequencies bands for communications standards such as WCDMA, DCS, PCS, EGSM, and GSM and for also supporting frequency bands such as band VII and band XI of LTE.

Figure 3:
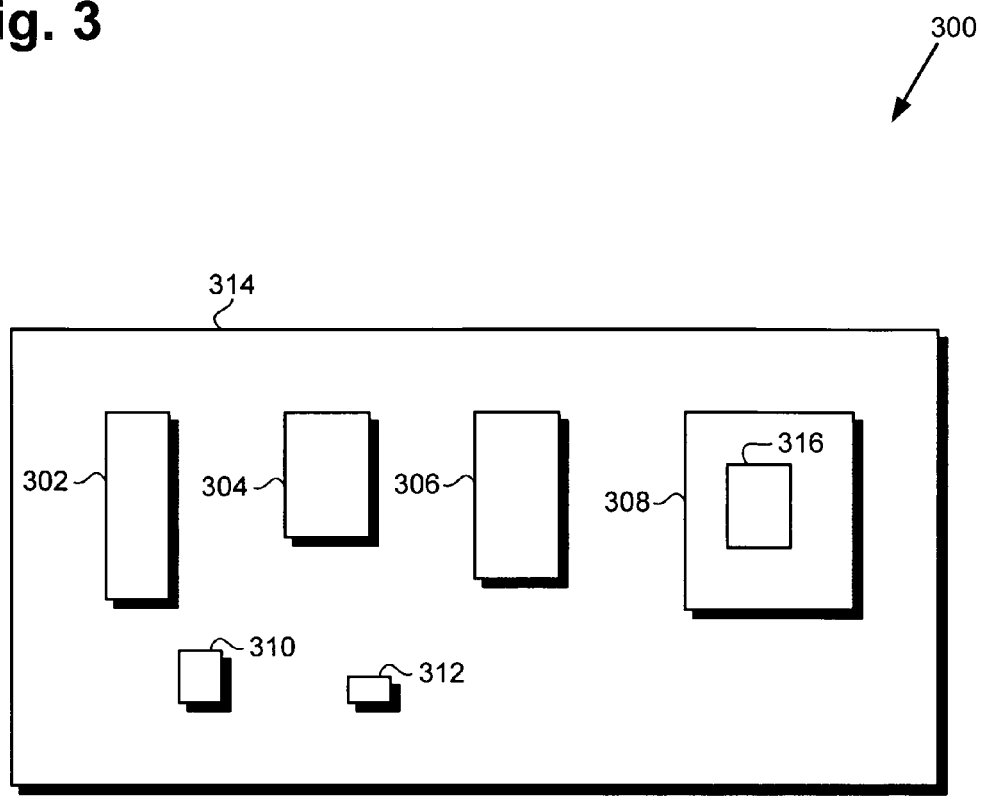
FIG. 3 is a diagram of an exemplary electronic system including an exemplary chip or die utilizing a voltage controlled oscillator in accordance with one embodiment of the present invention.

FIG. 3 illustrates a diagram of an exemplary electronic system including an exemplary chip or die utilizing a voltage controlled oscillator in accordance with one embodiment of the present invention. Electronic system 300 includes exemplary modules 302, 304, and 306, IC chip or semiconductor die 308, discrete components 310 and 312, residing in and interconnected through printed circuit board (PCB) 314. In one embodiment, electronic system 300 may include more than one PCB. IC chip 308 includes circuit 316, which can comprise one of the invention's voltage controlled oscillator, such as voltage controlled oscillator 100, including multi-tap inductor 110, as described above.

As shown in FIG. 3, modules 302, 304, and 306 are mounted on PCB 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. PCB 314 can include a number of interconnect traces (not shown in FIG. 3) for interconnecting modules 302, 304, and 306, discrete components 310 and 312, and IC chip 308.

Also shown in FIG. 3, IC chip 308 is mounted on PCB 314 and can be, for example, any chip utilizing an embodiment of the invention's voltage controlled oscillator. In one embodiment, IC chip 308 may not be mounted on PCB 314, and may be interconnected with other modules on different PCBs. As stated above, circuit 316 is situated in IC chip 308 and comprises an embodiment of the invention's voltage controlled oscillator. Further shown in FIG. 3, discrete components 310 and 312 are mounted on PCB 314 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 300 can be utilized in, for example, a wired or wireless communications device, a cell phone, a switching device, a router, a repeater, a codec, a wired or wireless LAN, a WLAN, a Bluetooth enabled device, a Global Positioning System (GPS) device, a computer, a monitor, a television set, a satellite set top box, a cable modem, a printer, a copier, an RF transceiver, a personal digital assistant (PDA), or in any other kind of system, device, component or module utilized in modern electronics applications.

Thus, as discussed above, by utilizing a multi-tap inductor having a high inductance portion coupled to a low band section for operation in a low band mode and a low inductance portion coupled to a high band section for operation in a high band mode, the invention achieves a voltage controlled oscillator that can operate in the low and high band modes to advantageously provide a wide tuning range without compromising the phase noise performance. Also, by utilizing a multi-tap inductor to provide a VCO having a wide tuning range, the present invention advantageously achieves a VCO that utilizes significantly less semiconductor die area compared to a conventional solution that utilize multiple VCOs to achieve a wide tuning range.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a voltage controlled oscillator with a multi-tap inductor has been described.

The invention claimed is:

1. A voltage controlled oscillator configured to operate in low and high band modes, said voltage controlled oscillator comprising:
a low band section and a high band section;
a multi-tap inductor having a high inductance portion coupled to said low band section and a low inductance portion coupled to said high band portion;
a low band bias circuit coupled to said low band section and a high band bias circuit coupled to said high band section, said low band bias circuit disabled in said high band mode and said high band bias circuit disabled in said low band mode;
said low band section being configured to provide a low frequency band oscillator output in said low band mode and said high band section being configured to provide a high frequency band oscillator output in said high band mode;

wherein said low band section includes a low band fine tuning circuit and said high band section includes a high band fine tuning circuit, said low band fine tuning circuit and said high band fine tuning circuit both controlled by a common control signal; and wherein said low band section includes a low band coarse tuning circuit and said high band section includes a high band coarse tuning circuit, said low band coarse tuning circuit disabled in said high band mode and said high band coarse tuning circuit disabled in said low band mode.

2. The voltage controlled oscillator of claim 1, wherein said low band section is disabled in said high band mode and said high band section is disabled in said low band mode.

3. The voltage controlled oscillator of claim 1, wherein a center tap of said multi-tap inductor is coupled to a supply voltage.

4. The voltage controlled oscillator of claim 1 wherein a control voltage controls said low band fine tuning circuit in said low band mode and said high band fine tuning circuit in said high band mode.

5. The voltage controlled oscillator of claim 1, wherein said low band section comprises at least one coarse tuning capacitor, wherein said at least one coarse tuning capacitor is enabled in said low band mode and disabled in said high band mode.

6. The voltage controlled oscillator of claim 1, wherein said high band section comprises at least one coarse tuning capacitor, wherein said at least one coarse tuning capacitor is enabled in said high band mode and disabled in said low band mode.

7. The voltage controlled oscillator of claim 1, wherein said multi-tap inductor comprises a first pair of taps and a second pair of taps, wherein said low inductance position is situated between said first pair of taps and said second inductance portion is situated between said second pair of taps.

8. A method for providing a low frequency band oscillator output and a high frequency band oscillator output, said method comprising:
enabling a low band section of a voltage controlled oscillator in a low band mode and a high band section of said voltage controlled oscillator in a high band mode, said low band section being coupled to a high inductance portion of a multi-tap inductor and said high band section being coupled to a low inductance portion of said multi-tap inductor, thereby providing said low frequency band oscillator output by said low band section in said low band mode and said high frequency band oscillator output by said high band section in said high band mode;
wherein said low band section is coupled to a low band bias circuit and said high band section is coupled to a high band bias circuit, said low band bias circuit disabled in said high band mode and said high band bias circuit disabled in said low band mode;
wherein said low band section includes a low band fine tuning circuit and said high band section includes a high band fine tuning circuit, said low band fine tuning circuit and said high band fine tuning circuit both controlled by a common control signal; and
wherein said low band section includes a low band coarse tuning circuit and said high band section includes a high band coarse tuning circuit, said low band coarse tuning circuit disabled in said high band mode and said high band coarse tuning circuit disabled in said low band mode.

9. The method of claim 8, wherein said low band section is disabled in said high band mode and said high band section is disabled in said low band mode.

10. The method of claim 8, wherein a center tap of said multi-tap inductor is coupled to a supply voltage.

11. The method of claim 8, further comprising a step of controlling said low band section by a control voltage in said low band mode.

12. The method of claim 8, further comprising a step of controlling said high band section by a control voltage in said high band mode.

13. The method of claim 8, further comprising a step of disabling at least one coarse tuning capacitor in said low band section in said high band mode.

14. The method of claim 8, further comprising a step of disabling at least one coarse tuning capacitor in said high band section in said low band mode.

15. A semiconductor die comprising a voltage controlled oscillator, said voltage controlled oscillator being configured to operate in low and high band modes, said voltage controlled oscillator comprising:
- a low band section and a high band section;
- a multi-tap inductor having a high inductance portion coupled to said low band section and a low inductance portion coupled to said high band section;
- a low band bias circuit coupled to said low band section and a high band bias circuit coupled to said high band section, said low band bias circuit disabled in said high band mode and said high band bias circuit disabled in said low band mode;
- said low band section providing a low frequency band oscillator output in said low band mode and said high band section providing a high frequency band oscillator output in said high band mode;
- wherein said low band section includes a low band fine tuning circuit and said high band section includes a high band fine tuning circuit, said low band fine tuning circuit and said high band fine tuning circuit both controlled by a common control signal; and
- wherein said low band section includes a low band coarse tuning circuit and said high band section includes a high band coarse tuning circuit, said low band coarse tuning circuit disabled in said high band mode and said high band coarse tuning circuit disabled in said low band mode.

16. The semiconductor die of claim 15, wherein said low band section is disabled in high band mode and said high band section is disabled in said low band mode.

17. The semiconductor die of claim 15, wherein a control voltage controls said low band section in said low band mode and said control voltage controls said high band section in said high band mode.

18. The semiconductor die of claim 15, wherein said low band section comprises at least one coarse tuning capacitor, wherein said at least one coarse tuning capacitor is enabled in said low band mode and disabled in said high band mode.

19. The semiconductor die of claim 15, wherein said semiconductor die is utilized in an electronic system selected from the group consisting of a wired or wireless communication device, a cell phone, a switching device, a router, a repeater, a codec, a wired ore wireless LAN, a WLAN, a Bluetooth enabled device, a Global Positioning System (GPS) device, a computer, a monitor, a television set, a satellite set top box, a cable modem, a printer, a copier, an RF transceiver, and a personal digital assistant (PDA).

* * * * *